(12) United States Patent
Lee

(10) Patent No.: US 12,132,131 B2
(45) Date of Patent: Oct. 29, 2024

(54) BACKSIDE ILLUMINATED AVALANCHE PHOTODIODE AND MANUFACTURING METHOD THEREOF

(71) Applicant: Sang Hwan Lee, Daejeon (KR)

(72) Inventor: Sang Hwan Lee, Daejeon (KR)

( * ) Notice: Subject to any disclaimer, the term of this patent is extended or adjusted under 35 U.S.C. 154(b) by 400 days.

(21) Appl. No.: 17/518,600

(22) Filed: Nov. 4, 2021

(65) Prior Publication Data

US 2022/0271182 A1 Aug. 25, 2022

(30) Foreign Application Priority Data

Feb. 24, 2021 (KR) .......................... 10-2021-0024755

(51) Int. Cl.
| | |
|---|---|
| *H01L 27/14* | (2006.01) |
| *H01L 27/146* | (2006.01) |
| *H01L 31/0224* | (2006.01) |
| *H01L 31/107* | (2006.01) |
| *H01L 31/18* | (2006.01) |

(52) U.S. Cl.
CPC ........ *H01L 31/107* (2013.01); *H01L 27/1464* (2013.01); *H01L 27/14643* (2013.01); *H01L 31/022408* (2013.01); *H01L 31/18* (2013.01)

(58) Field of Classification Search
CPC .......................... H01L 31/107; H01L 27/1464
See application file for complete search history.

(56) References Cited

U.S. PATENT DOCUMENTS

| | | | | |
|---|---|---|---|---|
| 7,667,400 | B1 * | 2/2010 | Goushcha | ........... H01L 31/1075 313/523 |
| 10,700,225 | B2 * | 6/2020 | Wang | .................. H04B 10/801 |
| 11,121,271 | B2 * | 9/2021 | Wang | ............... H01L 31/035281 |
| 2009/0121305 | A1 * | 5/2009 | Pan | ........................ H01L 31/18 438/69 |
| 2016/0308075 | A1 * | 10/2016 | Wang | .................. H01L 27/1446 |

(Continued)

FOREIGN PATENT DOCUMENTS

| | | | |
|---|---|---|---|
| CN | 117117012 A | * | 11/2023 |
| KR | 10-2017-0132467 | | 12/2017 |
| KR | 10-2176477 | | 11/2020 |

OTHER PUBLICATIONS

Notice of the Reasons for Rejection Dated Jun. 23, 2021 From the Korean Patent Office Re. Application No. 10-2021-0024755. (4 Pages).

*Primary Examiner* — Mounir S Amer
*Assistant Examiner* — Alexander Belousov

(57) ABSTRACT

Provided is a backside illuminated avalanche photodiode and a manufacturing method thereof. The backside illuminated avalanche photodiode comprises a semiconductor substrate; a semiconductor structure including a first semiconductor layer being arranged on a front surface of the semiconductor substrate and including a first conductivity type bottom electrical contact layer, a light absorption layer, and a multiplication layer, and a second semiconductor layer, stacked on the first semiconductor layer and including an etch stop layer and a second conductivity type top electrical conductivity layer stacked on the etch stop layer; a plurality of V-grooves in parallel with each other being formed by etching the top electrical contact layer; and a reflective top electrode formed by depositing a multi layer thin metal films on the top electrical contact layer wherein plurality of V-grooves parallel with each other are formed.

6 Claims, 9 Drawing Sheets

(56) References Cited

U.S. PATENT DOCUMENTS

| | | | |
|---|---|---|---|
| 2019/0013430 A1* | 1/2019 | Jones-Albertus | ........................... H01L 31/03048 |
| 2020/0168659 A1* | 5/2020 | Cumming | ......... H01L 27/14694 |
| 2020/0212237 A1* | 7/2020 | Roucka | ............. H01L 31/03046 |
| 2020/0295221 A1* | 9/2020 | Suarez | ................ H01L 27/1446 |
| 2021/0249545 A1* | 8/2021 | Roucka | ............ H01L 31/03048 |
| 2021/0305442 A1* | 9/2021 | Suarez | ................. H01L 31/105 |
| 2022/0271182 A1* | 8/2022 | Lee | .................... H01L 31/1075 |

* cited by examiner

BACKSIDE ILLUMINATED AVALANCHE PHOTODIODE AND MANUFACTURING METHOD THEREOF

RELATED APPLICATION

This application claims the benefit of priority of Korean Patent Application No. 10-2021-0024755 filed on Feb. 24, 2021, the contents of which are incorporated herein by reference in their entirety.

FIELD AND BACKGROUND OF THE INVENTION

The present invention relates to a backside illuminated avalanche photodiode and, more particularly, to a top electrode of backside illuminated avalanche photodiodes and a manufacturing method thereof.

A photodiode is an essential component of an optical receiver that converts light signal to electrical signal in optical communication systems. Increasing traffic in wired and wireless networks is creating a great demand for increased transmission capacity in optical communication systems. Recently, photodiodes for optical receivers having an operating speed of 25 Giga baud per second (GBd/sec) are commercialized to meet with increasing transmission capacity of optical communication systems, and the operating speed of photodiodes is expected to increase 50 GBd/sec and 100 GBd/sec sequentially with an interval of four to five years. A photo-electric conversion efficiency or a quantum efficiency of a PIN photodiode is limited to 100% in principle. In contrast, an avalanche photodiode having a charge carrier multiplication layer can multiply the number of photo-generated charge carriers by impact ionization and thus can achieve photoelectrical conversion efficiency exceeding 100%. Such an avalanche photodiodes are used for long distance optical communications longer than 10 km requiring high receiver sensitivity.

In order to increase an operating speed and a bandwidth of a photodiode, RC time constant and carrier transit time have to be reduced simultaneously, and that requires the physical dimensions of a photodiode in both lateral and vertical directions to a PN junction are reduced. Particularly, a reduction of a light absorption layer thickness of a photodiode according to the vertical scaling results in a decrease of light absorption efficiency that is the most important feature of a photodiode.

A backside illuminated photodiode was developed to enhance the light absorption efficiency of traditional top illuminated photodiodes having a thin absorption layer thickness not sufficient to fully absorb incident light. In a prior arts, a top electrode arranged on top side of a backside illuminated avalanche photodiode serves both as an ohmic contact to a top most semiconductor layer and as a reflection means to transmitted light that passed through the thin light adsorption layer in an incoming path back to the light adsorption layer for a second absorption. In conventional backside illuminated photodiode, the top electrode reflects the transmitted light unabsorbed portion of the incident light, normally to the absorption layer by its parallel epitaxial layers structure. On the other hand, decrease of the top electrode area by the lateral dimension scaling down for high-speed operation of a photodiode results in an increase of a contact resistance of the top electrode. The increase of contact resistance leads to an increase of series resistance of photodiode, and finally decreases a RC bandwidth of photodiode. In addition, when metal films having a poor reflectance than a high-reflectivity dielectric mirror are used for the top electrode, reflection efficiency of the transmitted light can be reduced.

A backside illuminated avalanche photodiode according to one aspect of the present invention provides a corrugated top electrode structure which increases the effective surface area of the top electrode and reduces an ohmic contact resistance of the top electrode. A backside illuminated avalanche photodiode according to an another aspect of the present invention provides a corrugated top electrode structure that reflects the transmitted light obliquely back to the light absorption layer and thus a propagation path length and second absorption efficiency of the transmitted light can be increased.

SUMMARY OF THE INVENTION

An objective of the present invention is to provide a top electrode structure that can increase the absorption efficiency and decrease the contact resistance of a backside illuminated avalanche photodiodes, and a manufacturing method thereof.

The present invention is not limited to the above-described objective. From the following description, it would be apparent to a person of ordinary skill in the art that another objective and an advantageous effect may be derived.

According to an aspect of the present invention, there is provided a backside illuminated avalanche photodiode comprising:

a semiconductor substrate;
a semiconductor structure including, a first semiconductor layer stacked on a front surface of the semiconductor substrate and including a first conductivity type bottom electrical contact layer, a light absorption layer, and a multiplication layer; and a second semiconductor layer stacked on the first semiconductor layer and including an etch stop layer and a second conductivity type top electrical contact layer sequentially stacked on the first semiconductor layer; a plurality of V-grooves in parallel with each other formed by etching the second conductivity type top electrical contact layer; and a corrugated top electrode formed on the second conductivity type top electrical contact layer.

According to an aspect of the present invention, there is provided a method of manufacturing a backside illuminated avalanche photodiode, the method comprising steps of:

growing a semiconductor structure on a front surface of a semiconductor substrate including,
a first semiconductor layer, including a first conductivity type bottom electrical contact layer, a light absorption layer, and a multiplication layer, and
a second semiconductor layer stacked on the first semiconductor layer, including an etch stop layer and a second conductivity type top electrical contact layer stacked on the etch stop layer;
depositing an etching mask material on a top surface of the semiconductor structure;
forming a plurality of V-groove etching patterns in parallel with each other on the etching mask by photolithography and an etching mask material removal process, wherein a long axis of the V-groove etching patterns are aligned to [0$\bar{1}$1] and [01$\bar{1}$] crystallographic directions of the semiconductor substrate;
forming a plurality of V-grooves by etching the second conductivity type top electrical contact layer in an anisotropic etching solution; and forming a reflective top electrode by depositing multi layer metal films on the top electrical contact layer.

In backside illuminated avalanche photodiodes having a thin light absorption layer not enough to absorb most of an incidence light, according to an embodiment of the present invention, a plurality of V-grooves are formed in the second conductivity type top electrical contact layer, wherein the contact area between the top electrode and the top electrical contact layer is increased than that of the flat top electrical contact layer, thus the ohmic contact resistance between the top electrical contact layer and top electrode is reduced.

According to an embodiment of the present invention, a corrugated top electrode structure serving both as an ohmic contact to the top electrical contact layer and a light reflection means to a transmitted light is provided, wherein the corrugated top electrode structure reflects a transmitted light back to the absorption layer with an oblique angle at least greater than zero degree such that a propagation path length and an absorption efficiency of the reflected light can be increased than that of a flat top electrode structure.

The above-described advantageous effects become more effective as the physical size reduction of photodiodes is progressed to meet with demand for improving the operation speed of photodiodes.

Various advantageous effects of the present invention are not limited to the effects described above and would be understood more easily from descriptions of specific embodiments of the present invention.

DETAILED DESCRIPTION OF EXEMPLARY EMBODIMENTS

Figure 1:
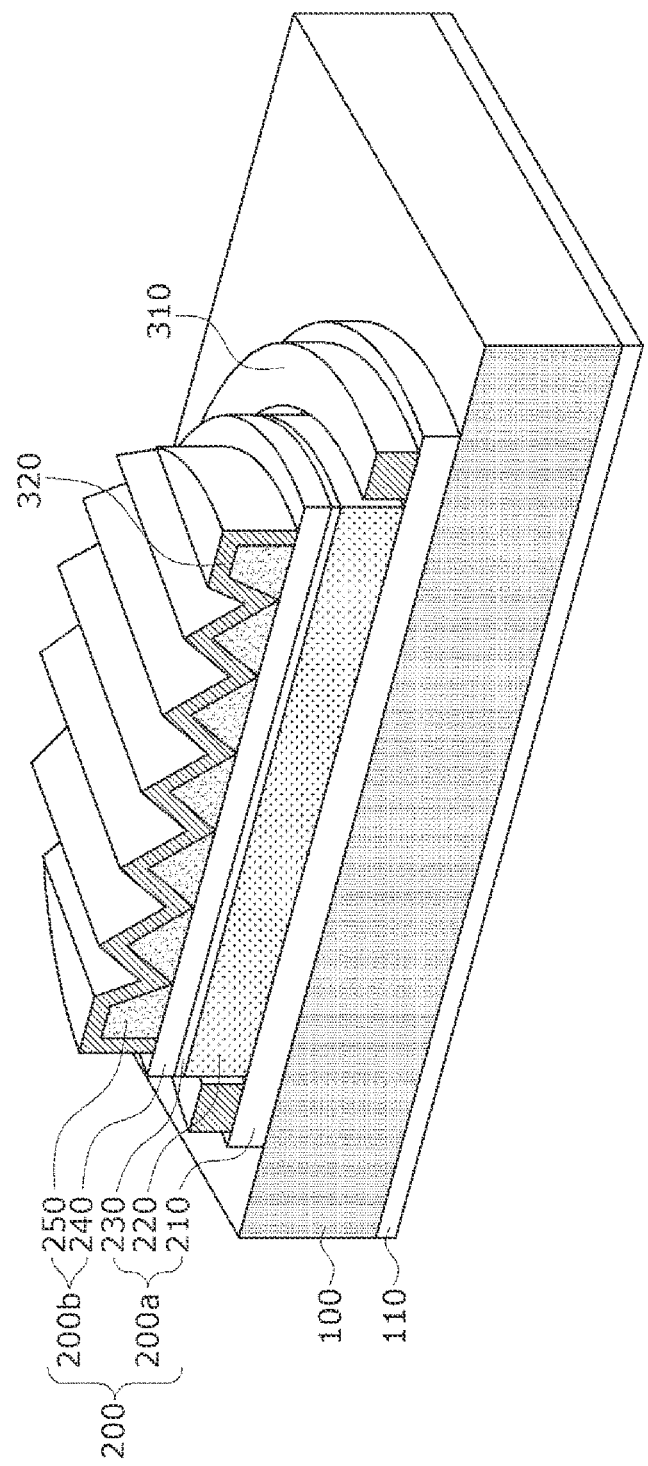
FIG. 1 is a schematic illustration of a cross-section of a backside illuminated avalanche photodiode according to a first embodiment of the present invention.

Preferred embodiments of the present invention will be described in detail below with reference to the accompanying drawings.

However, the technical idea of the present invention is not restricted to embodiments described below and may be embodied in various different forms. One or more of constituent elements may be selectively combined or substituted among the embodiments if such a combination or a substitution falls within the scope of the technical idea of the present invention.

In addition, unless otherwise specifically defined in a clear manner, the meanings of the terms (including the technical and scientific terms) for embodiments of the present invention should be construed in a manner that is commonly understandable to a person of ordinary skill in the art to which the present invention pertains. The meanings of the terms that, like ones defined in a dictionary, are commonly used should be interpreted considering contextual meanings defined in the relevant technology.

In addition, the terms for the embodiments of the present invention are employed to describe the embodiments thereof and are not intended to impose any limitation on the present invention.

Throughout the present specification, unless otherwise specifically mentioned in a phrase or sentence, the indefinite articles "a" and "an" can apparently mean either the singular or the plural. The expression "at least one (or one or more) of A, B, and C" may be construed to include any one or more of A, B, and C.

In addition, the terms first, second, A, B, (a), (b) and so forth may be used in describing a constituent element according to the embodiments of the present invention.

These terms are used only to distinguish one constituent element from another constituent element and do not impose any limitation on features of these constituent elements, the order thereof or a sequence thereof, and the like.

In addition, when one constituent element is formed or arranged "on" another constituent element, this means that the two constituent elements are in contact with each other. When one constituent element is formed or arranged "over (above)" or "under (below)" another constituent element, this means that one or more other constituent element may be formed or arranged between the two constituent elements. In addition, the expression "over (above)" or "under (below)" may be construed as indicating an upward direction or a downward direction on the drawings, depending on a reference direction from which one constituent element is drawn.

A backside illuminated avalanche photodiode comprising: a semiconductor substrate; a semiconductor structure grown on the semiconductor substrate including, a first semiconductor layer stacked on a front surface of the semiconductor substrate and including a first conductivity type bottom electrical contact layer, a light absorption layer, a multiplication layer, and a second semiconductor layer stacked on top of the first semiconductor layer and including an etch stop layer and a second conductivity type top electrical contact layer stacked on top of the etch stop layer; a plurality of V-grooves in parallel to each other, formed by etching the second conductivity type top electrical contact layer; and a corrugated top electrode formed on a surface of the second conductivity type top electrical contact layer. The proposed corrugated top electrode structure for a backside illuminated avalanche photodiode can increase an absorption efficiency of transmitted light and can decrease an ohmic contact resistance compared to the flat top electrode structure.

FIG. 1 is a perspective cross-sectional view illustrating a structure of the backside illuminated avalanche photodiode according to the first embodiment of the present invention.

With reference to FIG. 1, the backside illuminated avalanche photodiode according to the first embodiment of the present invention includes, but not limited thereto, a semiconductor substrate 100, a semiconductor structure 200, a bottom electrode 310, and a top electrode 320.

The semiconductor substrate 100 can be made of a single crystalline semiconductor material, wherein the semiconductor material can be one selected from the group consisting of a Si, Ge, InP, GaAs, InAs, GaP, InSb, GaN, CdS, GaSb, and HgCdTe.

The semiconductor substrate 100 can be a semi-insulating having an impurity concentration of at least less than $5 \times 10^{15}/cm^3$. The semiconductor substrate 100 may have bandgap energy greater than the photon energy of incident light. An anti-reflection layer 110 that can reduce reflection of incident light may be formed on a backside of the semiconductor substrate 100. The anti-reflection layer 110 may be consisted of at least one dielectric layer. In particular, the anti-reflection layer 110 may be silicon oxide or silicon nitride.

The semiconductor structure 200, wherein light absorption and photo current generation is taking place, may include a first semiconductor layer 200a and a second semiconductor layer 200b sequentially stacked on the semiconductor substrate 100. The first semiconductor layer 200a includes a first conductivity type bottom electrical contact layer 210, a light absorption layer 220, and a multiplication layer 230. The second semiconductor layer 200b includes an etch stop layer 240 and a second conductivity type top electrical contact layer 250.

The semiconductor structure 200 exemplified in the present invention is configured to include only a minimum components of semiconductor layers necessary for describing the embodiments of the present invention. A plurality of semiconductor layers used for avalanche photodiodes may be further included. In addition to that, the semiconductor structure 200 may further include metal films and surface protection layers. The plurality of semiconductor layers may include such as buffer layers, field control layers, and bandgap grading layers. The plurality of semiconductor layers can be different from each other in terms of atomic composition, dopant type, and bandgap energy.

In addition, the semiconductor structure 200 may be replaced with one of various types of photodiodes, such as PIN PD, uni-traveling carrier (UTC) PD, and modified-UTC PD, by adding or removing semiconductor layers from the semiconductor structure 200.

The first conductivity type bottom electrical contact layer 210 may be a N-type semiconductor, and the second conductivity type top electrical contact layer 250 may be a P-type semiconductor. Alternatively, the first conductivity type bottom electrical contact layer 210 may be a P-type semiconductor, and the second conductivity type top electrical contact layer 250 may be a N-type semiconductor.

The light absorption layer 220 absorbs incident light and generates electron and hole pairs. The light absorption layer 220 can be consisted of an undoped or a doped semiconductor, such as InGaAs, Ge, SiGe, or InAs having bandgap energy equal to or less than photon energy of incident light. Alternatively, the light absorption layer 220 may be consisted of a combination of an undoped semiconductor and a p-type semiconductor.

In order to absorb most of the incident light, the light absorption layer 220 should have a thickness greater than a threshold thickness determined by the absorption coefficient of the light absorption material. However, to meet the physical size reduction required for increasing the operation speed of a photodiode, thickness of a light absorption layer is continuously decreasing less than the threshold thickness, thereby the light absorption efficiency of a high speed photodiode is continuously decreasing.

In avalanche photodiode, the multiplication layer 230 multiplies the number of electrons and holes that generated in the light absorption layer 220 by impact ionization induced by strong electric field in the multiplication layer. The multiplication layer 230 can be consisted of a semiconductor material, such as InP, InAlAs, and Si having bandgap energy greater than photon energy of incident light.

The multiplication layer 230 is described as being disposed on top of the light absorption layer 220, but in contrast, may be located underneath the light absorption layer 220. In addition, various semiconductor layers, such as field control layers and bandgap grading layers, that are necessary for constituting a conventional avalanche photodiode may be further included between the light absorption layer 220 and the multiplication layer 230.

Pluralities of V-grooves are formed on the central portion of top electrical contact layer 250. More particularly, the V-grooves are formed in a manner parallel with each other and substantially covering most of the surface of the top electrical contact layer 250.

The bottom electrode 310 is disposed on a peripheral portion of the bottom electrical contact layer 210, at a predetermined distance apart from the light absorption layer 220. The top electrode 320 is formed to cover most of the surface of the top electrical contact layer 250.

The bottom electrical contact layer 210 and the top electrical contact layer 250 have opposite electrical conductivity type, both heavily doped with an impurity concentration of at least higher than $5 \times 10^{17}/cm^3$. More particularly, the bottom electrical contact layer 210 and the top electrical contact layer 250 have bandgap energy greater than the incident light photon energy and thus prevent absorption of the incident light.

The top electrode 320 makes an ohmic contact with the top electrical contact layer 250, and at the same time reflects a transmitted light, a portion of incident light that passed through the absorption layer, back to the light absorption layer 220 for a second absorption.

In addition, a side surface of the semiconductor structure 200 may be coated with a protective material, such as a dielectric film or a polymer for reducing leakage current.

Figure 2:
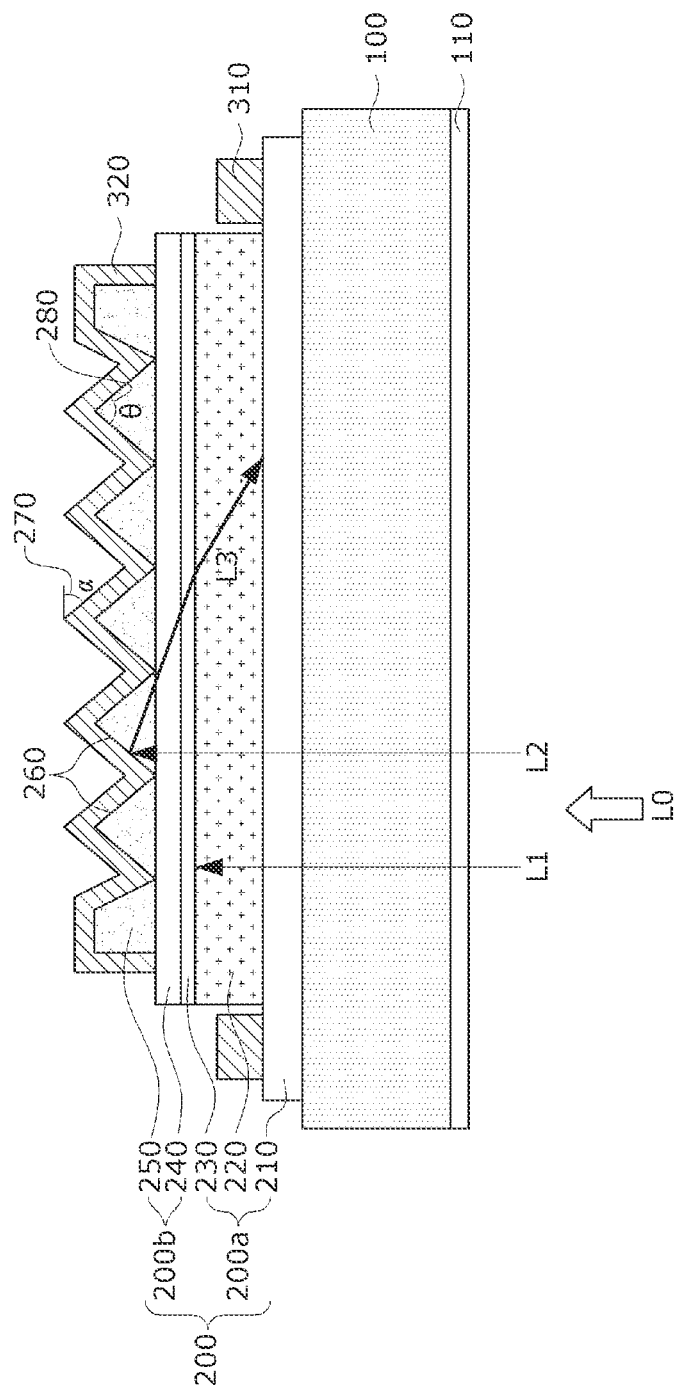
FIG. 2 is a view illustrating propagation paths of incident light, transmitted light, and reflected light in the backside illuminated avalanche photodiode according to the first embodiment.

FIG. 2 illustrate a propagation paths of incident light, transmitted light, and reflected light in the backside illuminated avalanche photodiode according to the first embodiment.

With reference to FIG. 2, L0 represents an incident light propagating from the backside of the semiconductor substrate 100 to the semiconductor structure 200. L1 represents a portion of incident light L0 that totally absorbed in the light absorption layer 220. L2 represents a transmitted light, a portion of the incident light L0 that transmitted through the light absorption layer 220 unabsorbed thereof in its incoming path. L3 represents a reflected light, a portion of L2 that reflected at the reflection interface 260, having a slope angle α 270 with respect to the surface of the substrate, between the top electrical contact layer 250 and the top electrode 320, back toward the light absorption layer 220 with an oblique incident angle. Wherein, the incidence angle of the reflected light L3 with respect to a normal of the underlying layers that substantially parallel to the surface of substrate, is at least greater than zero degree because the reflection interface 260 has a slope angle greater than zero degree by the law of reflection. Thus, a propagation path length of the reflected light L3 passing through the light absorption layer 220 increases greater than the thickness of the absorption layer and thereby, light absorption efficiency of the reflected light increase than that of a normal incidence. In certain circumstances, the propagation direction of L3 may vary through the underlying layers because of the refraction effect at the multiple interfaces of underlying layers, such as the top electrical contact layer 250, the etch stop layer 240, the multiplication layer 230 and the light absorption layer 220, but it is neglected herein.

Figure 3:
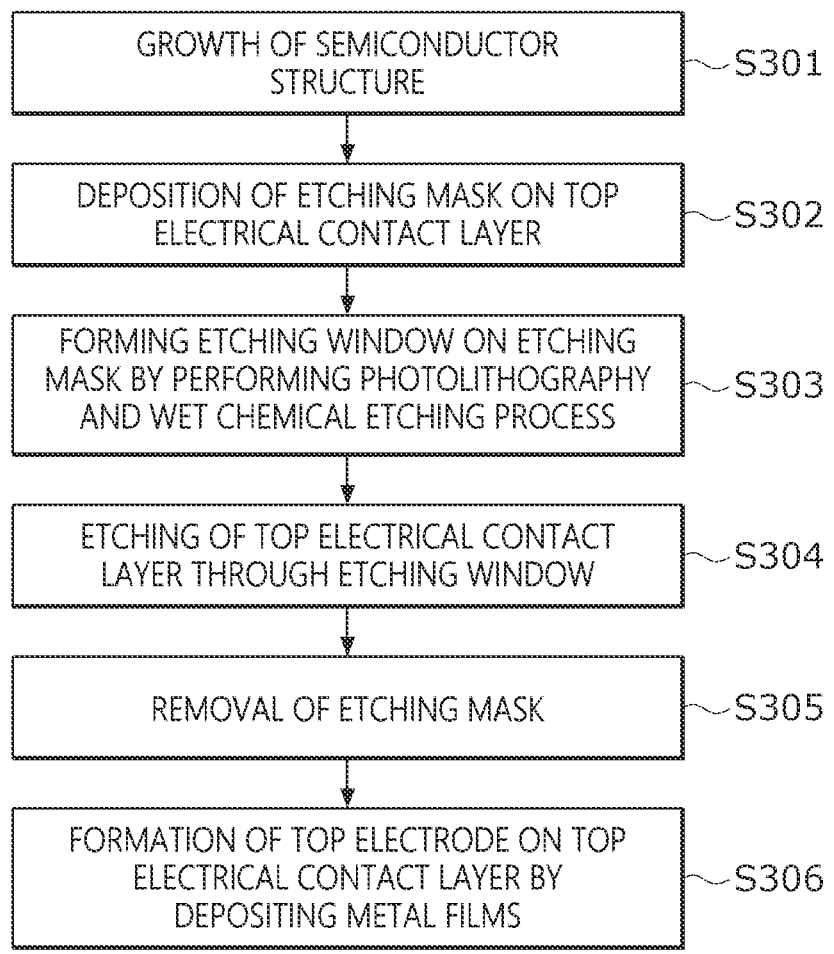
FIG. 3 is a flow chart illustrating a method of manufacturing the backside illuminated avalanche photodiode according to the first embodiment of the present invention.

FIG. 3 is a flow chart illustrating steps for manufacturing the backside illuminated avalanche photodiodes according to the present invention.

FIGS. 4A to 4F are cross sectional view illustrating a method of manufacturing the backside illuminated avalanche photodiodes. Processing steps only related to manufacturing the top electrode 320 are described in detail hereinafter. Descriptions on processes related to other elements of avalanche photodiodes are skipped, such as bottom electrode formation, surface passivation film deposition, backside lens formation, and antireflection film formation, that necessary for manufacturing conventional avalanche photodiodes before or after the top electrode 320 has been formed.

With reference to FIGS. 3 and 4A to 4F, according to the present invention, a semiconductor substrate 100 is provided. Next, a semiconductor structure including a first semiconductor layer 200a and a second semiconductor layer 200b are sequentially grown on the semiconductor substrate 100 by a molecular-beam epitaxy (MBE) or a metalorganic chemical vapor deposition (MOCVD) technology (S301). Wherein, the first semiconductor layer 200a may include a first conductivity type bottom electrical contact layer 210, a light absorption layer 220 stacked on top of the first conductivity type bottom electrical contact layer 210, and a multiplication layer 230 stacked on top of the light absorption layer 220. Wherein, the second semiconductor layer 200b may include an etch stop layer 240 and a second conductivity type top electrical contact layer 250 sequentially stacked on the first semiconductor layer 200a.

Figure 4A:
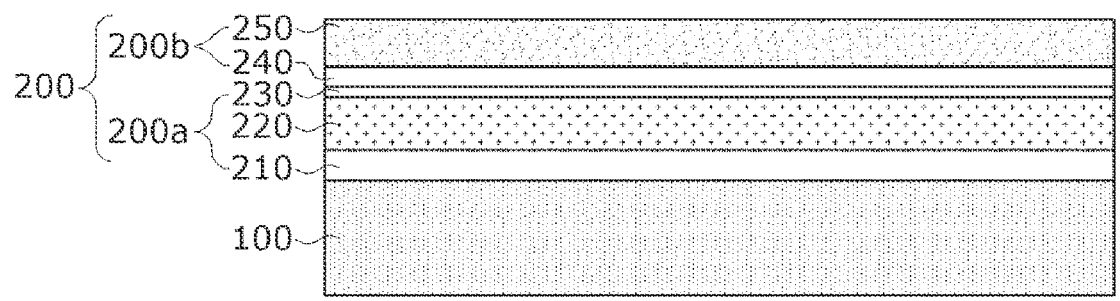
FIGS. 4A, 4B, 4C, 4D, 4E and 4F are views illustrating steps in the method of manufacturing the backside illuminated avalanche photodiode.
Figure 4B:
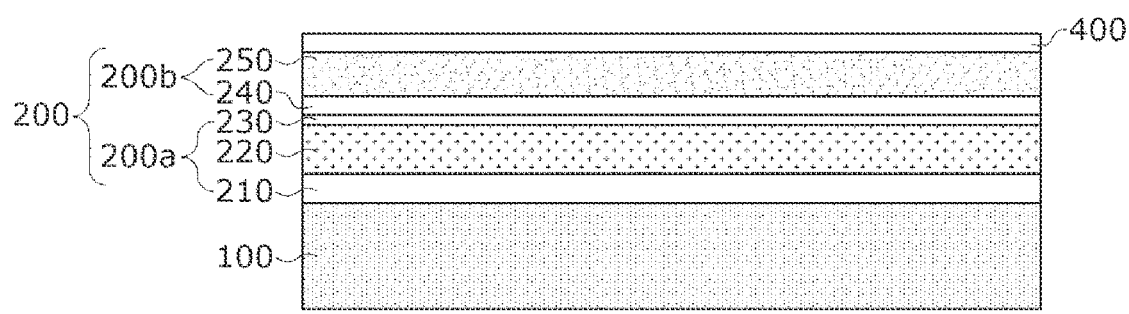

Next with reference to FIG. 4B and S302, an etching mask 400 is deposited on the top electrical contact layer 250. Herein, silicon oxide, silicon nitride, or the combination thereof can be used for the etching mask 400. The etching mask 400 may be deposited by using various thin film deposition methods such as PECVD and LPCVD.

Figure 4C:
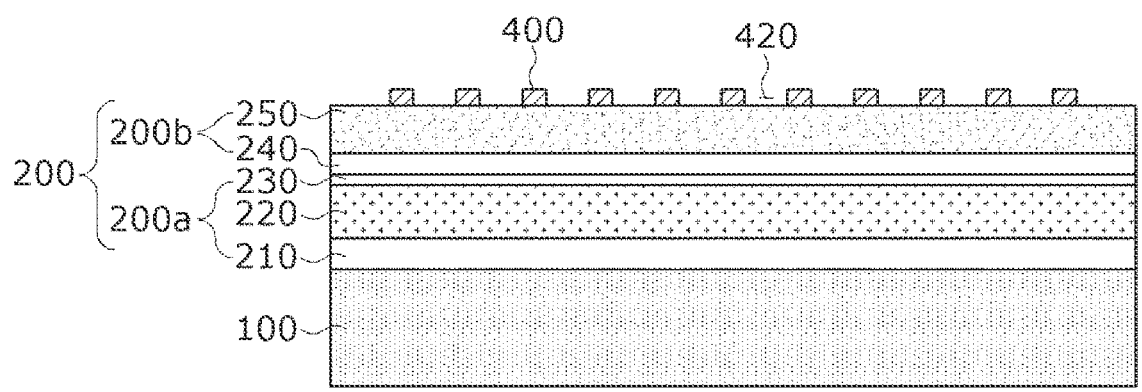

Next with reference to FIG. 4C and S303, the etching mask 400 is selectively removed by a photolithography and by dry or wet etching of the etching mask, and thus etching windows 420 having long and narrow channels substantially parallel with each other are formed.

Figure 4D:
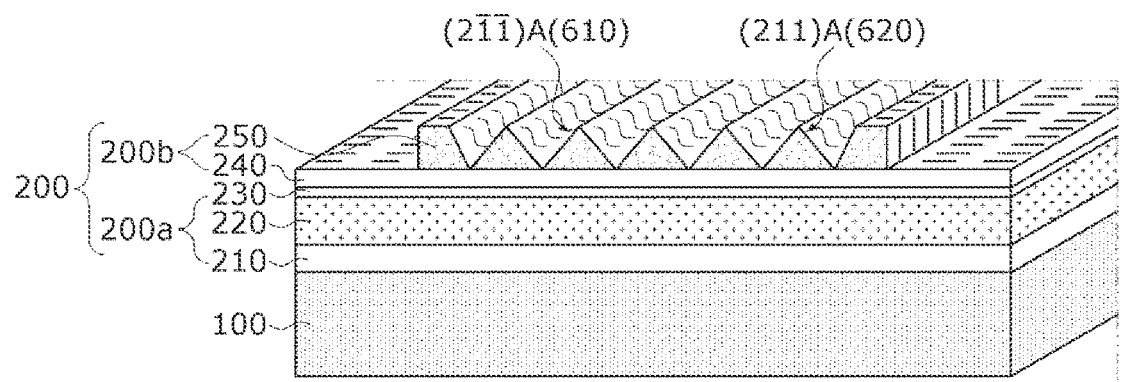

Next with reference to FIG. 4D and S304, the top electrical contact layer 250 is chemically etched in aqueous etching solution through the etching windows 420. In this step, an anisotropic wet chemical etching is preferred because it can provide V-grooves having flat mirror-like sidewalls bounded by semiconductor crystal planes. For instance, FIG. 4D shows V-grooves formed on the top electrical contact layer, having sidewalls comprised of (2$\bar{1}$$\bar{1}$)A 610 and (211)A 620 crystal planes. More particularly, by properly designing the gap between the V-grooves, the flat-top area on top side of the second electrical contact layer can be removed and then, two adjacent sidewalls of the top electrical contact layer 250 has a triangular prism shape with an apex.

Figure 4E:
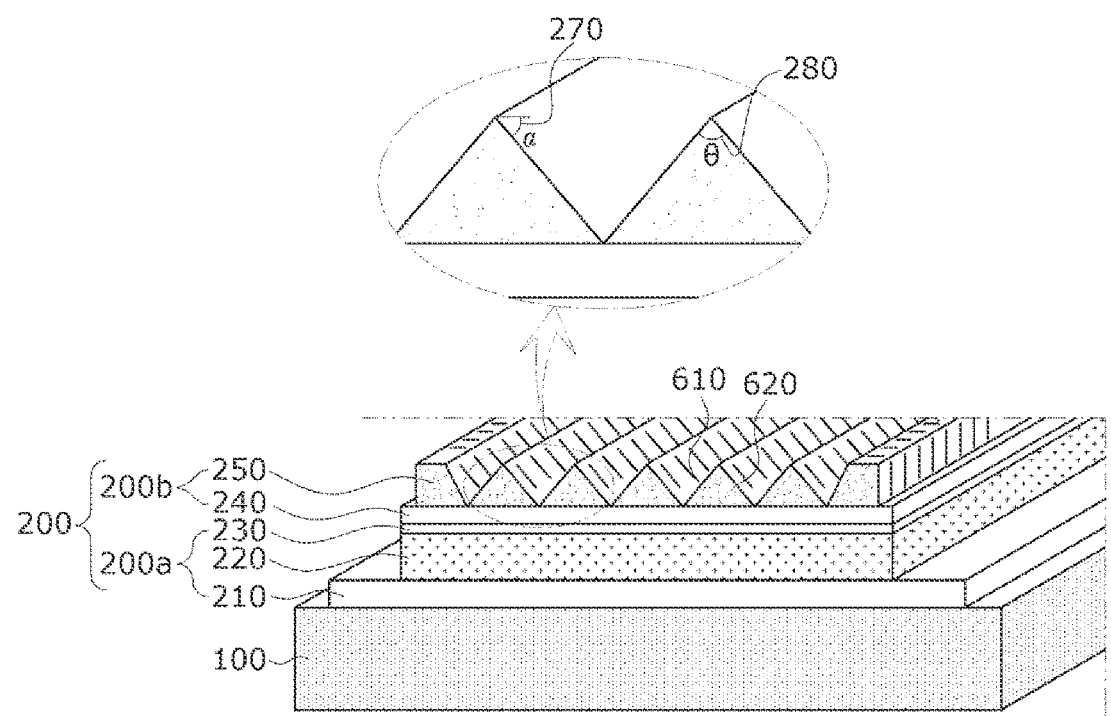

FIG. 4E shows an enlarged view of the V-grooves having a slope angle α 270 with respect to the surface of the substrate and an apex angle θ 280 of prism. A method of forming V-grooves having two sidewalls comprised of (211)A 610 and (2$\bar{1}$$\bar{1}$)A 610 crystal planes in (100) InP wafers will be described in detail at below.

In the V-groove etching process (S304), the etch stop layer 240 prevents the underlying multiplication layer 230 is attacked from the etching solution when bottoms of the V-grooves are reached to the bottom of the top electrical contact layer 250. For the purpose, the etch stop layer 240 can be formed of a semiconductor material having a very slow etch rate in the etching solution. For example, HCl+H$_3$PO$_4$+H$_2$O solution etches InP very fast but may not etch InGaAs. Therefore, when the top electrical contact layer 250 is formed of InP, the etch stop layer 240 can be preferably an InGaAs, In a case of dry etching is employed for the V-groove formation, the etching can be stopped when a portion of the top electrical contact layer 250 is remained. Subsequently, the remaining portion thereof can be selectively removed by wet chemical etching.

Next, the etching mask 400 remained on the top electrical contact layer 250 is removed (S305).

Figure 4F:
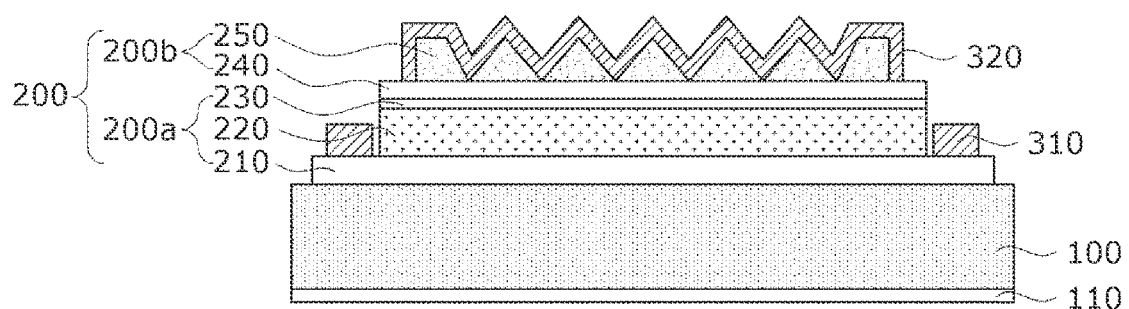

Next with reference to FIG. 4F and S306, the top electrode 320 is formed by depositing multilayer metal films on the top electrical contact layer 250. The top electrode 320 can be consisted of metal films that make an ohmic contact with the top electrical contact layer 250. For example, the top electrode 320 may be one multilayer metal films selected from a Ti/Pt/Au, Cr/Pt/Au, AuGe/Ni/Au, Ag/Ge/Au or the like. In the step S306, the multilayer metal films may be deposited on the etch stop layer 240 too, but has to be limited within the area of the light absorption layer 220. The etch stop layer 240 may be formed of a semiconductor material capable of making an ohmic contact with the top electrode 320. For example, the etch stop layer 240 may be a semiconductor material heavily doped with P-type or N-type dopant at least higher than $5 \times 10^{17}/cm^3$. In order to prevent absorption of incident light, a semiconductor material having bandgap energy greater than photon energy of the incident light is preferred for the etch stop layer 240. In the case of lower bandgap material is used for the etch stop layer 240, the thickness of the etch stop layer 240 may be less than several tens of nanometers so that minimize the absorption of incident light. Other processing steps necessary for manufacturing a mesa type photodiode can be performed before or after the top electrode 320 is formed. For example, the bottom electrode 310 as shown in FIG. 2 can be formed before or after the top electrode 320 formation. In addition, the top electrode 320 and the bottom electrode 310 may be formed at the same time after the top electrical contact layer 250 is etched. The bottom electrode 310 may be disposed on peripheral area of the bottom electrical contact layer 210 with an open strip form. For example, the bottom electrode 310 is formed on an edge portion of the bottom electrical contact layer 210. More particularly, the bottom electrode 310 may have an open stripe form substantially surrounding the light absorption layer 220, arranged apart from a predetermined distance thereof.

After the processes on the front side of a semiconductor substrate are finished, an antireflection layer 110 may be formed on a backside of the semiconductor substrate. According to the present invention, backside lens can be formed on the backside of the substrate.

In the backside illuminated avalanche photodiode according to the first embodiments, the top electrode 320 disposed over the light absorption layer 220 makes an ohmic contact with top electrical contact layer and also provides a reflection means for the transmitted light.

As the area of the top electrode of photodiodes is decreasing to meet with the higher operation speed demands, ohmic contact resistance of the top electrode, a most significant component of series resistance and restricting the RC bandwidth of photodiodes, is increasing. Furthermore, most metal films used for an ohmic contact have a low reflectivity compared to a high-reflectivity dielectric mirror, and thus the reflection efficiency of top electrode is low.

In the backside illuminated avalanche photodiode according to embodiments of the present invention, by providing a top electrode structure having corrugated semiconductor-metal interface, an effective surface area of top electrode is increased such that an ohmic contact resistance between the semiconductor and the top electrode can be reduced, and an incident angle of reflected light with respect to the normal of underlying semiconductor layers entering the light absorption layer 220 is increased such that a propagation path length of the reflected light passing through the light absorption layer 220 and the reuse efficiency of transmitted light can be increased.

To maximize the surface area of the ohmic contact, the angle α 270 of the reflection interface 260 in FIG. 2 and FIG. 4E is need to close to 90 degrees. Whereas, the reflection surfaces 260 needs to have a slope angle at least smaller than 45 degrees in order to directly turn the reflected light back to the underlying absorption layer 220 and the substrate 100. Accordingly, meeting the two conditions described above and to maximize an absorption enhancement effect, the reflection interface 260 need to have a slope angle α 270 close to 45 degrees with respect to the surface of the substrate 100.

Single crystalline semiconductors having a cubic crystal structure, such as Silicon or Indium phosphide, have a crystallographic orientation dependent etching characteristics wherein, etch rate varies widely depending on crystal planes or directions. For instance, when etching patterns (window) having an arbitrary shape is etched in an orientation dependent etching solution for a sufficient time, a rectangular pattern surrounded with side walls composed of the lowest etch rate is formed. In the case of Si, {111} crystal plane group have the lowest etch rate. In the case of InP, {111} or {211} crystal plane group have the lowest etch rate depending on etching solutions. The {111} crystal planes of (100) semiconductor wafer having a cubic crystal structure are inclined 54.7 degrees with respect to (100) surface, and the {211} crystal planes thereof are inclined 35 degrees with respect to the (100) surface. Therefore, v-grooves bounded by the {211} crystal plane group of the (100) semiconductor wafer having a cubic crystal structure are a good candidate as a reflection surfaces for an objective of the prevent invention. More particularly, in (100) orientation InP wafers, (211)A and (2$\overline{11}$)A crystal planes can be used as reflection surfaces that can reflect transmitted light back to the substrate. Wherein, the (211)A and (2$\overline{11}$)A crystal planes have an internal angle of 110 degrees. Above mentioned angles α and θ are crystallographically determined angles, but in real situation the angles may have a variation in the range of ±5 degrees, therefore the slope angle α may be in the range of 30~40 degrees, and the internal angle θ may be in the range of 100-120 degrees. The v-grooved surface structure having 35 degrees slope angle can have a 22% larger surface area than that of a flat surface. When a (100) InP wafer is used for the substrate, a corrugated surface structure composed of v-grooves that bounded by (211)A and (2$\overline{11}$)A crystal planes can be formed by using an anisotropic or orientation dependent wet etching technique. For example, V-grooves bounded by sidewalls composed of (211)A and (2$\overline{11}$)A crystal planes can be formed by using HCl containing etching solutions.

Figure 5:
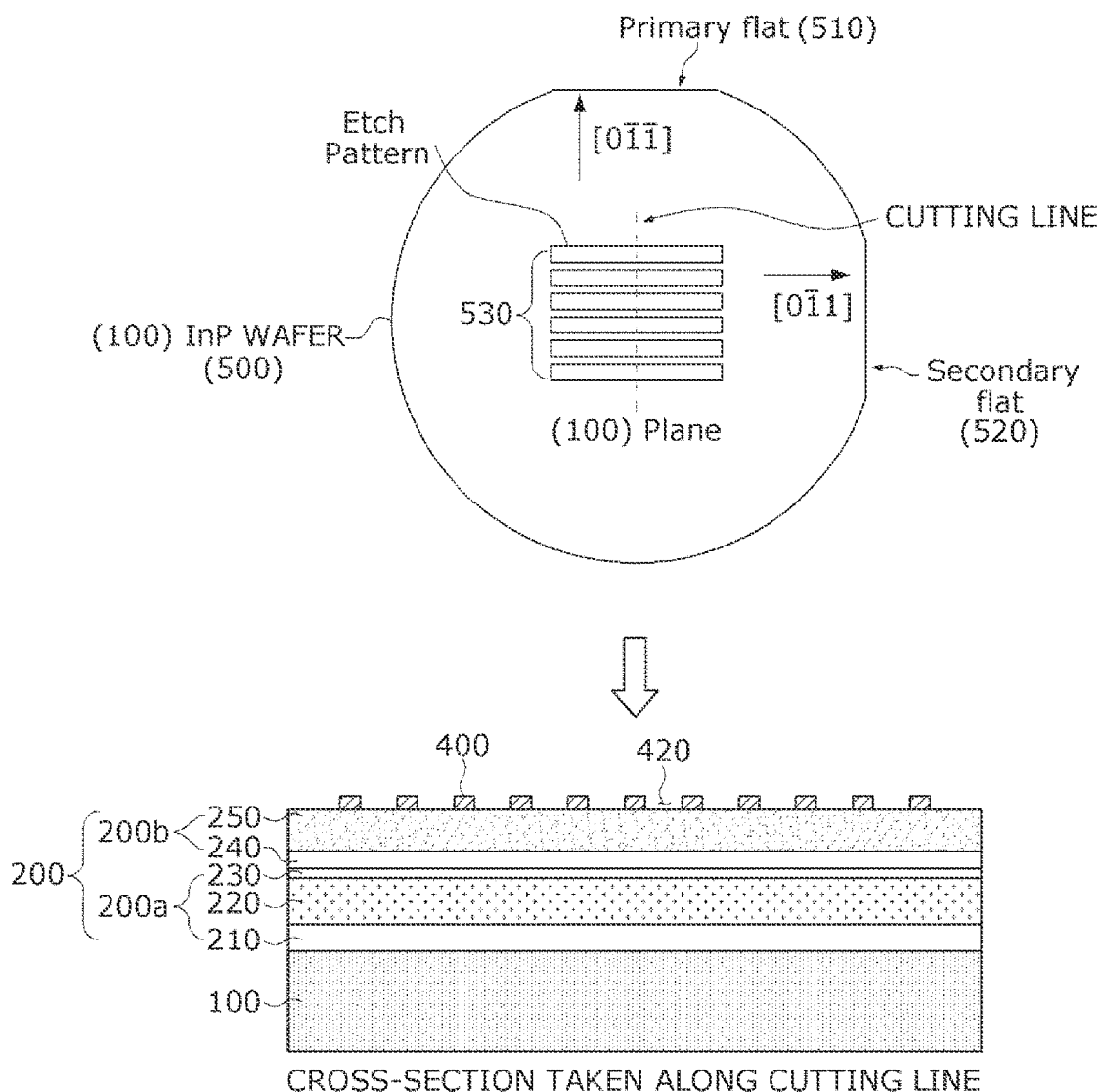
FIG. 5 is a view illustrating a method of forming a V-groove etching pattern.

FIG. 5 is a view illustrating a method of forming v-grooves parallel with each other on the top electrical contact layer 250 according to the first embodiment present invention.

With reference to FIG. 5, in general, (100) InP wafer has a primary flat 510 and a secondary flat 520 orthogonal to each other, where in the secondary flat 520 is rotated clockwise by 90 degrees with respect to the primary flat 100. More particularly, the primary flat 510 is cut in a manner that is perpendicular to a [0$\overline{11}$] and [011] crystallographic directions and in parallel to [0$\overline{1}$1] and [01$\overline{1}$] crystallographic directions. V-groove etching pattern 530 is patterned on the top electrical contact layer 250 in such a manner that a long axis thereof is aligned to be in parallel with the primary flat 510 of the wafer. Thus, the reflection surface is aligned in a manner that is in parallel with the [0$\overline{1}$1] and [01$\overline{1}$] crystallographic directions. In this case, a shot axis of the V-groove etching pattern 530 is in parallel with the [011] crystallographic direction.

FIG. 4E is a perspective view illustrating the top electrical contact layer 250 formed on the etch stop layer 240 in the same manner as described above. A bottom of the top electrical contact layer 250 can be brought into contact with the etch stop layer 240, and the surface of the top electrical contact layer 250 may have a triangular prism shape with an apex angle θ 280 of approximately 100~120 degrees being composed of (2$\overline{11}$)A crystal plane 610 and (211)A crystal plane 620. In the case, the angle 270 of which two reflecting surfaces 610 and 620 make with respect to the extended line in parallel to the surface of the substrate is approximately 30~40 degrees.

In the case, the etch stop layer 240 serves as preventing the first semiconductor layer 200a located at underneath of the top electrical contact layer 250 from being successively etched when the bottom surface of the top electrical contact layer 250 is exposed. In order to achieve the purpose, the etch stop layer 240 may be formed of a semiconductor material having a very low etch rate in the top electrical contact layer 250 etching solution. For example, when the top electrical contact layer 250 is made of InP and the etch stop layer 240 is made of InGaAs, the top electrical contact layer 250 can be etched in the solution of $HCl+H_3PO_4+H_2O$, but the etch stop layer 240 may be unetched.

Figure 6:
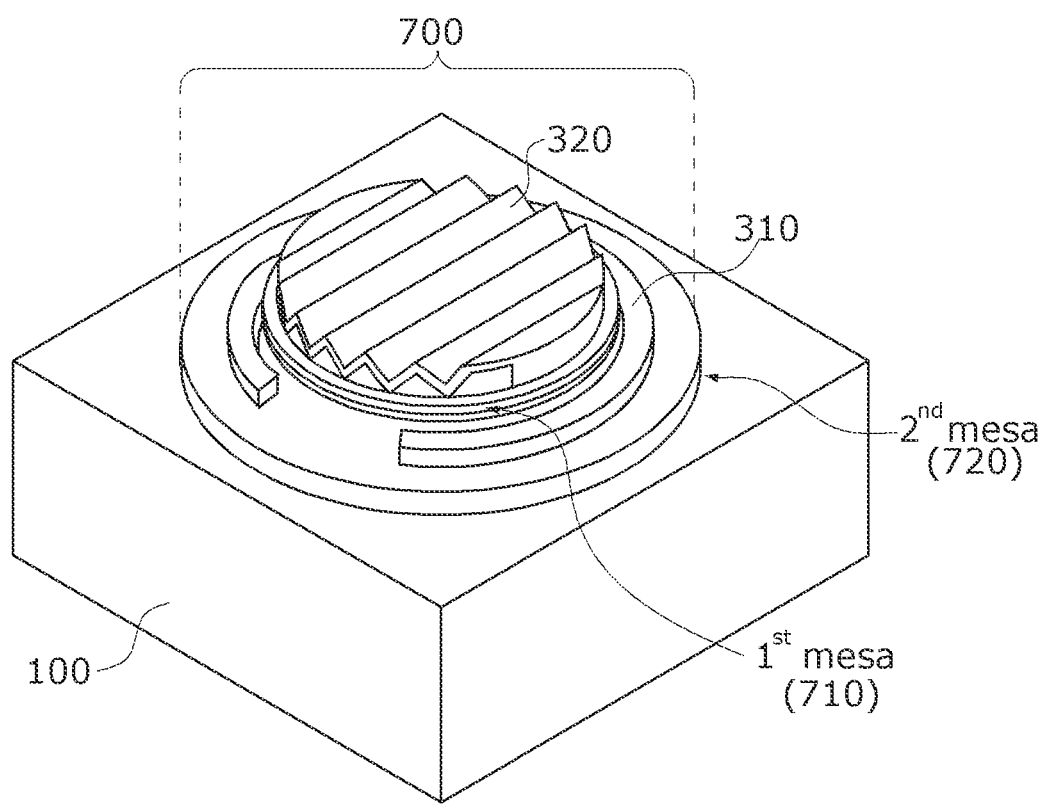
FIG. 6 is a perspective view of the backside illuminated avalanche photodiode according to the first embodiment of the present invention.

FIG. 6 is a view illustrating a perspective view of the backside illuminated avalanche photodiode according to the first embodiment of the present invention, wherein a detailed description on the method of manufacturing thereof is omitted.

With reference to FIG. 6, a backside illuminated avalanche photodiode having a mesa type active region 700 according to the first embodiment is presented. In more detail, the bottom electrical contact layer 210 and the bottom electrode 310 formed in the peripheral area of the active region 700 constitute a second mesa 720, and a first mesa 710 is arranged on a central portion of the second mesa 720. The active region 700 may be configured to include the light absorption layer 220, the multiplication layer 230, the etch stop layer 240, and the top electrical contact layer 250. According to the present invention, the active region 700 is not limited to a mesa type, but a planar type semiconductor structure can be applied.

In addition, the elements of first mesa 710 is not limited to the light absorption layer 220, the multiplication layer 230, the etch stop layer 240, and the top electrical contact layer 250. According to some embodiments, a plurality of semiconductor layers, such as field control layers and bandgap grading layers, may be further included in the first mesa 710 whenever necessary. According to some other embodiments, the multiplication layer 230 can be omitted from the first mesa 710. According to some other embodiments, the light absorption layer 220 and the multiplication layer 230 may be stacked in reverse order. According to some other embodiments, a plurality of different semiconductor layers may be formed underneath the light absorption layer 220 or on the multiplication layer 230. The plurality of semiconductor layers that can be included in the active region 700 may differ from each other in at least one of atomic composition, dopant type, doping concentration, and bandgap energy.

The second mesa 720 is not limited to the first conductivity type bottom electrical contact layer 210 and the bottom electrode 310 that described above, According to some other embodiments, a plurality of semiconductor layers, such as buffer layers, electrical field control layers, and bandgap grading layers, that are different from each other in at least one of atomic composition, dopant type, doping concentration, and bandgap energy may be formed on top of and underneath of the bottom electrical contact layer 210 whenever necessary.

Figure 7:
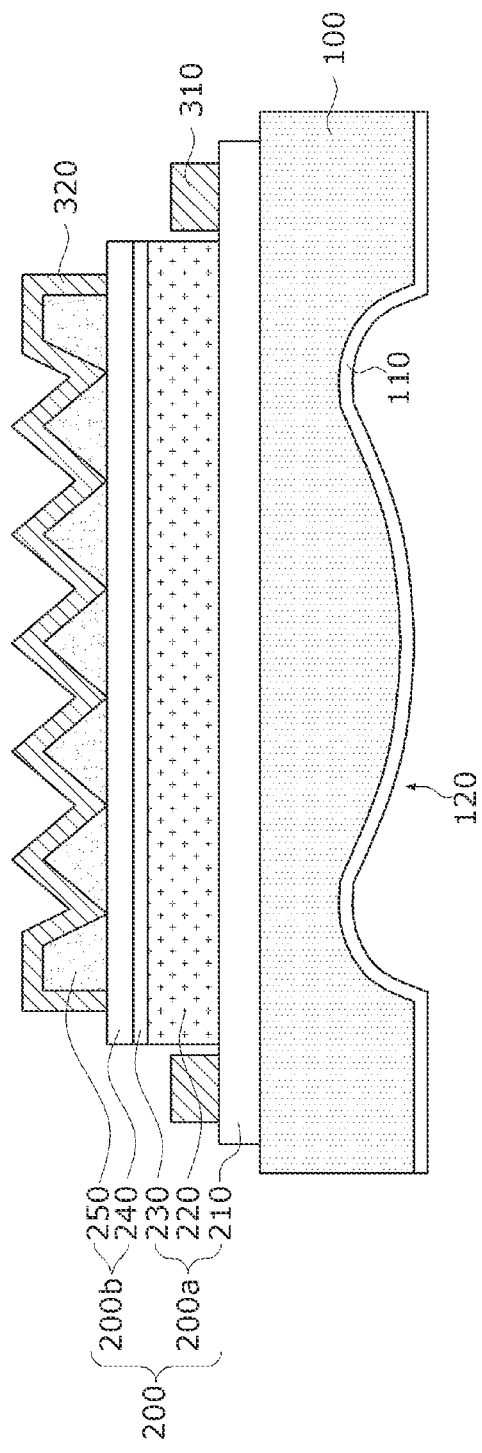
FIG. 7 is a view illustrating a backside illuminated avalanche photodiode according to a second embodiment of the present invention.

FIG. 7 is a view illustrating a backside illuminated avalanche photodiode according to a second embodiment of the present invention.

With reference to FIG. 7, in addition to the semiconductor substrate 100, the semiconductor structure 200, the bottom electrode 310, and the top electrode 320, the backside illuminated avalanche photodiode according to the second embodiment may be configured to further includes a backside lens 120 formed by etching the backside of the semiconductor substrate 100 and an antireflection layer 110 for preventing reflection of incident light coated on the lens 120 surface.

The backside illuminated avalanche photodiode according to the second embodiment further includes the lens 120 in addition to the constituent elements of the backside illuminated avalanche photodiode according to the first embodiment thus, descriptions of the constituent elements other than the lens 120 are omitted.

The lens 120 focuses diverging or collimated light that are incident thereon into the light absorption layer 220. The lens 120 can be formed by wet etching or dry etching method.

According to the second embodiment, the lens 120 is formed on the backside of the semiconductor substrate 100. Thus, when the avalanche photodiode is passively aligned to an optical fiber or an optical waveguide, the lens 120 can increase a light receiving efficiency and a misalignment tolerance in a direction parallel to the surface of the substrate.

The preferred embodiments of the present invention are described above, but it would be apparent to a person of ordinary skill in the art that various modifications or alterations may be made to the embodiments within the idea and scope of the present invention that is defined in the following claims.

DESCRIPTION OF REFERENCE NUMERALS

100: semiconductor substrate
110: antireflection layer
120: lens
200: semiconductor structure
210: first conductivity type bottom electrical contact layer
220: light absorption layer
230: multiplication layer
240: etch stop layer
250: second conductivity type top electrical contact layer
260: reflection interface
270: slope angle of reflection interface with respect to surface of substrate
280: apex angle of prism
310: bottom electrode
320: top electrode
400: semiconductor structure
410: etching mask
420: V-groove etching window
500: (100) InP wafer
510: primary flat
520: secondary flat
530: V-groove etching pattern
610: (2$\bar{1}\bar{1}$)A crystal plane of InP
620: (211A crystal plane of InP
700: active region
710: $1^{st}$ mesa
720: $2^{nd}$ mesa

What is claimed is:

1. A backside illuminated avalanche photodiode comprising:
   a semiconductor substrate;
   a semiconductor structure including,
   a first semiconductor layer stacked on a front surface of the semiconductor substrate and including a first conductivity type bottom electrical contact layer, a light absorption layer, and a multiplication layer, and
   a second semiconductor layer stacked on the first semiconductor layer, including an etch stop layer and a second conductivity type top electrical contact layer stacked on top of the etch stop layer;
   a plurality of V-grooves in parallel with each other, formed by etching the second conductivity type top electrical contact layer; and
   a reflective top electrode formed on the second conductivity type top electrical contact layer.

2. The backside illuminated avalanche photodiode of claim 1, wherein the top electrode serves both as a reflecting means and an ohmic contact means.

3. The backside illuminated avalanche photodiode of claim 1, wherein the light absorption layer and the multiplication layer are stacked in reverse order on the first semiconductor layer.

4. The backside illuminated avalanche photodiode of claim 1, wherein the first semiconductor layer further includes one or more of a buffer layer, field control layers, and bandgap grading layers.

5. The backside illuminated avalanche photodiode of claim 1, having a lens formed by etching a backside of the semiconductor substrate.

6. A method of manufacturing a backside illuminated avalanche photodiode comprising steps of:
   growing a semiconductor structure on a front surface of a semiconductor substrate including,
   a first semiconductor layer stacked on a front surface of the semiconductor substrate, including a first conductivity type bottom electrical contact layer, a light absorption layer, and a multiplication layer, and
   a second semiconductor layer stacked on top of the first semiconductor layer, including an etch stop layer and a second conductivity type top electrical contact layer stacked on the etch stop layer;
   depositing an etching mask on a top surface of the semiconductor structure;
   forming a plurality of V-groove etching patterns in parallel with each other on the etching mask by photolithography and an etching mask removal process, wherein a long axis of the V-groove etching patterns are aligned to [0$\bar{1}$1] and [01$\bar{1}$] crystallographic directions of the semiconductor substrate;

forming a plurality of V-grooves by etching the second conductivity type top electrical contact layer in etching solution; and forming a reflective top electrode by depositing multi layer metal films on the second conductivity type top electrical contact layer.

* * * * *